(12) United States Patent
Erlach

(10) Patent No.: US 7,533,792 B2
(45) Date of Patent: May 19, 2009

(54) ELASTIC INTERFACE FOR WAFER BONDING APPARATUS

(75) Inventor: David M. Erlach, Santa Barbara, CA (US)

(73) Assignee: Innovative Micro Technology, Goleta, CA (US)

( * ) Notice: Subject to any disclaimer, the term of this patent is extended or adjusted under 35 U.S.C. 154(b) by 411 days.

(21) Appl. No.: 11/347,219

(22) Filed: Feb. 6, 2006

(65) Prior Publication Data

US 2007/0181633 A1    Aug. 9, 2007

(51) Int. Cl.
*B23K 37/00*    (2006.01)
(52) U.S. Cl. ........................................ 228/5.5; 228/106
(58) Field of Classification Search ................. 228/5.5
See application file for complete search history.

(56) References Cited

U.S. PATENT DOCUMENTS 3,616,141 A * 10/1971 Anderson ................... 428/116
2003/0075275 A1 * 4/2003 Kubota ....................... 156/382
2007/0040565 A1 * 2/2007 Jayabalan et al. ........... 324/765

* cited by examiner

*Primary Examiner*—Kiley Stoner
*Assistant Examiner*—Nicholas P D'Aniello
(74) *Attorney, Agent, or Firm*—Jaquelin K. Spong

(57) ABSTRACT

An apparatus for bonding a lid wafer to a device wafer includes an elastic interface having a first surface and a second surface. Relieved areas may be created in the elastic interface by removing at least some of the elastic material of the interface, leaving a mesh with nodes. Raised areas may be disposed on the nodes in staggered positions on the first surface relative to the second surface. The bonding pressure deflects the raised features on the first surface in one direction and the raised features on the second surface in another direction. The restoring force of the mesh transmits the pressure through the interface and to a lid wafer and a device wafer, to bond the lid wafer to the device wafer.

16 Claims, 7 Drawing Sheets

ELASTIC INTERFACE FOR WAFER BONDING APPARATUS

CROSS REFERENCE TO RELATED APPLICATIONS

Not applicable.

STATEMENT REGARDING FEDERALLY SPONSORED RESEARCH

Not applicable.

STATEMENT REGARDING MICROFICHE APPENDIX

Not applicable.

BACKGROUND

This invention relates to wafer bonding techniques. More particularly, this invention relates to a system and method for bonding imperfect or out-of-flat wafers together.

Microelectromechanical systems (MEMS) are integrated micro devices which may be fabricated using integrated circuit batch processing techniques. MEMS devices have a variety of applications including sensing, controlling and actuating on a micro scale. Accordingly, MEMS devices often include a moveable component such as a sensor or actuator. Because the MEMS devices are generally moveable, they are also vulnerable to damage from handling or contamination. Therefore, the devices are often encapsulated with a lid wafer to protect the moveable component. In addition, some MEMS devices, such as infrared bolometers, require vacuum environment to obtain optimum performance. Accordingly, a lid wafer may need to be sealed against the device wafer with a hermetic bond.

To form the encapsulated device, a lid wafer is aligned to the device wafer, and lid wafer and device wafers are pressed together while heating to cure an adhesive which permanently bonds the wafers in position. The individual devices may then be subsequently singulated, for further packaging with an applications-specific integrated circuit (ASIC), for example. The circuitry of the application-specific integrated circuit may control the functioning of the moveable component of the MEMS device.

If either the lid wafer or the device wafer is out-of-flat or otherwise imperfect, a disproportionate share of the pressure between the wafers is supported on a few points, rather than applied uniformly across the wafer. As a result, bonding may be poor in regions where the pressure is not applied uniformly, which may destroy the hermeticity of the seal, or the adhesion between the wafers. In order to distribute the force more uniformly, a compressible insert may be placed between a pressure-generating chuck and the assembly to be bonded, that is, the device wafer and the lid wafer.

An example of a prior art wafer bonding tool 100 is shown schematically in FIG. 1. The wafer bonding tool 100 includes a pressure chuck 110 which applies a downward bonding force 120 on the lid wafer 140 against a device wafer 150. The device wafer 150 is supported by a wafer chuck 160. A graphite pad 130 may be inserted as the compressible insert between the pressure chuck 110 and the lid wafer 140. The purpose of the graphite pad is to distribute the force 120 over a wider area. Since the graphite pad is compressible, it may become compressed in areas sustaining the maximum pressure, and expanding to fill areas which would otherwise not be in contact.

However, the graphite pad has a number of disadvantageous features. For example, it can support a maximum deformation of on the order of tens of microns, whereas non-uniformities on the order of 50 microns or more may exist between the wafer pair. Therefore, the graphite pad may "bottom out" in a situation wherein 50 microns or so of non-uniformity exists between the wafer surfaces. This situation may result in all of the bonding force being born over a small area, or even at a single point on the wafer, leading to non-uniform bonding over the wafer, or worse, cracking of the wafer, leading to an increased scrap rate.

Furthermore, because the deformation of the graphite pad is not entirely elastic, it does not completely return to its original shape after deformation. As a result, the lifetime of the graphite pads may also be limited to tens of bonding cycles, before its loss of elasticity renders it unusable. In addition, the graphite pad is known to shed debris which may contaminate the package and interfere with the functioning of the MEMS device.

SUMMARY

Systems and methods are described herein which improve upon the prior art by replacing the deformable graphite pad with an elastic interface having raised features which may be used in a wafer bonding tool. The elastic interface may comprise a first surface and a second surface, with the raised features on the first surface disposed in a staggered position with respect to the raised features on the second surface.

The elastic interface may further comprise a mesh surrounding relieved areas disposed in the elastic interface, with the mesh forming a plurality of nodes at its intersection points. The mesh may be of a design and material having a desirable spring rate. The raised features may be disposed on the nodes of the mesh. For example, the raised features on the bottom surface may occur at every other node of the mesh, and the raised features on the top surface occurring at the intervening nodes. Alternatively, the raised features may be placed in a staggered relationship on the top and bottom of a continuous sheet of elastic material. The restoring force of the mesh or the continuous sheet may transmit the bonding force from a pressure chuck to a support chuck, across the whole surface of a wafer assembly in a relatively uniform fashion.

By using material having good yield properties, known spring rate and proven reliability, such as spring steel or shim stock, a spring capable of nearly perfect elastic deformation, along with predictable and well known performance attributes. Also by using such a material, reliable performance over a long lifetime may result.

The staggered features may transmit the force from the mesh in a manner which may vary over the width of the elastic interface, by varying, for example, the pitch of the mesh or the height of the raised features.

The elastic interface may be manufactured inexpensively using any of a number of methods. For example, it may be manufactured using a photochemical procedure, wherein photoresist is deposited on the spring or shim stock, exposed in the areas in which raised features areas are not to be formed, developed and removed in the exposed areas, and then the photoresist-covered shim stock is exposed to, for example, an acid etch. The acid etch then etches material around the raised features at the desired locations in the shim stock. The mesh pattern may be similarly produced using photochemical methods, including depositing photoresist on the spring or shim stock, exposing the photoresist, developing and removing the photoresist in areas corresponding to the open areas of the mesh, and etching the open areas using, for example, an acid etch.

These and other features and advantages are described in, or are apparent from, the following detailed description

BRIEF DESCRIPTION OF THE DRAWINGS

Various exemplary details are described with reference to the following figures, wherein.

DETAILED DESCRIPTION

The systems and methods described herein may be particularly applicable to microelectromechanical systems (MEMS) devices, wherein a small, moveable structure may be formed on a device substrate, using lithographic processes common in the semiconductor industry. Because the moveable structure can be damaged by exposure to an ambient environment or may be vulnerable to handling, the device wafer is often assembled with an encapsulating lid wafer and bonded to the device wafer. The bonding seal may be made by anodic bonding, epoxy, or a metal alloy, for example.

The bonding of the lid wafer to the MEMS device wafer may be performed in a wafer bonder, such as that manufactured by Suss Micro Tec of Munich, Germany, or EV Group of Schaerding, Austria. The purpose of the wafer bonding tool is to apply pressure and heat to an aligned two-wafer assembly, consisting of a device wafer and a lid wafer, in order to bond the device wafer to the lid wafer. After bonding, the die may be singulated by sawing the two-wafer assembly apart.

It should be understood that the systems and methods described herein may be applied to any type of wafer, such as CMOS device wafers as well as MEMS device wafers, that may need to be bonded to another wafer. For example, the first wafer may be a MEMS wafer, and the lid wafer may include CMOS circuitry used to control the MEMS devices.

Figure 1:
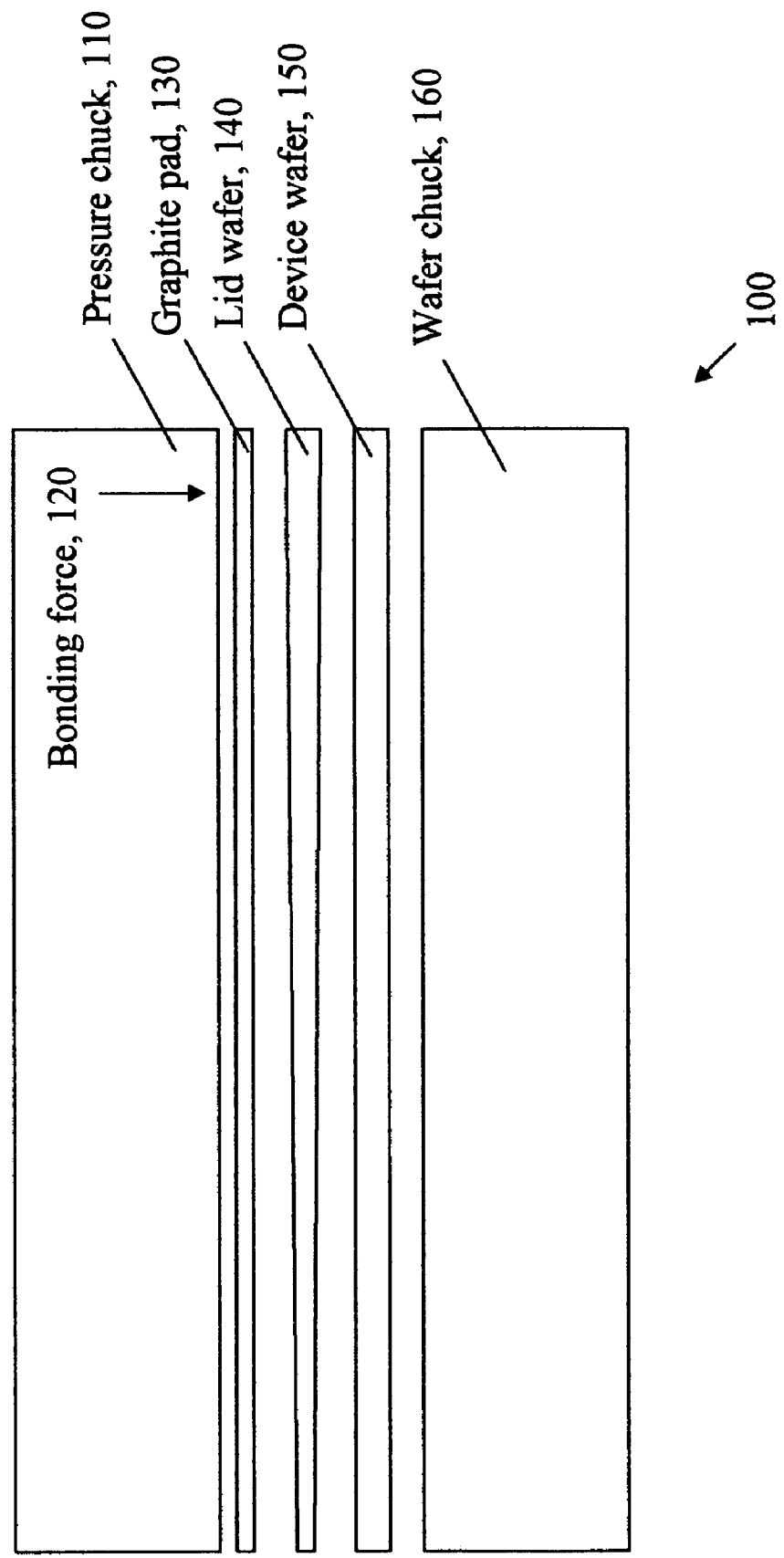
FIG. 1 is a cross sectional view showing an exemplary wafer bonding tool according to the prior art.
Figure 2:
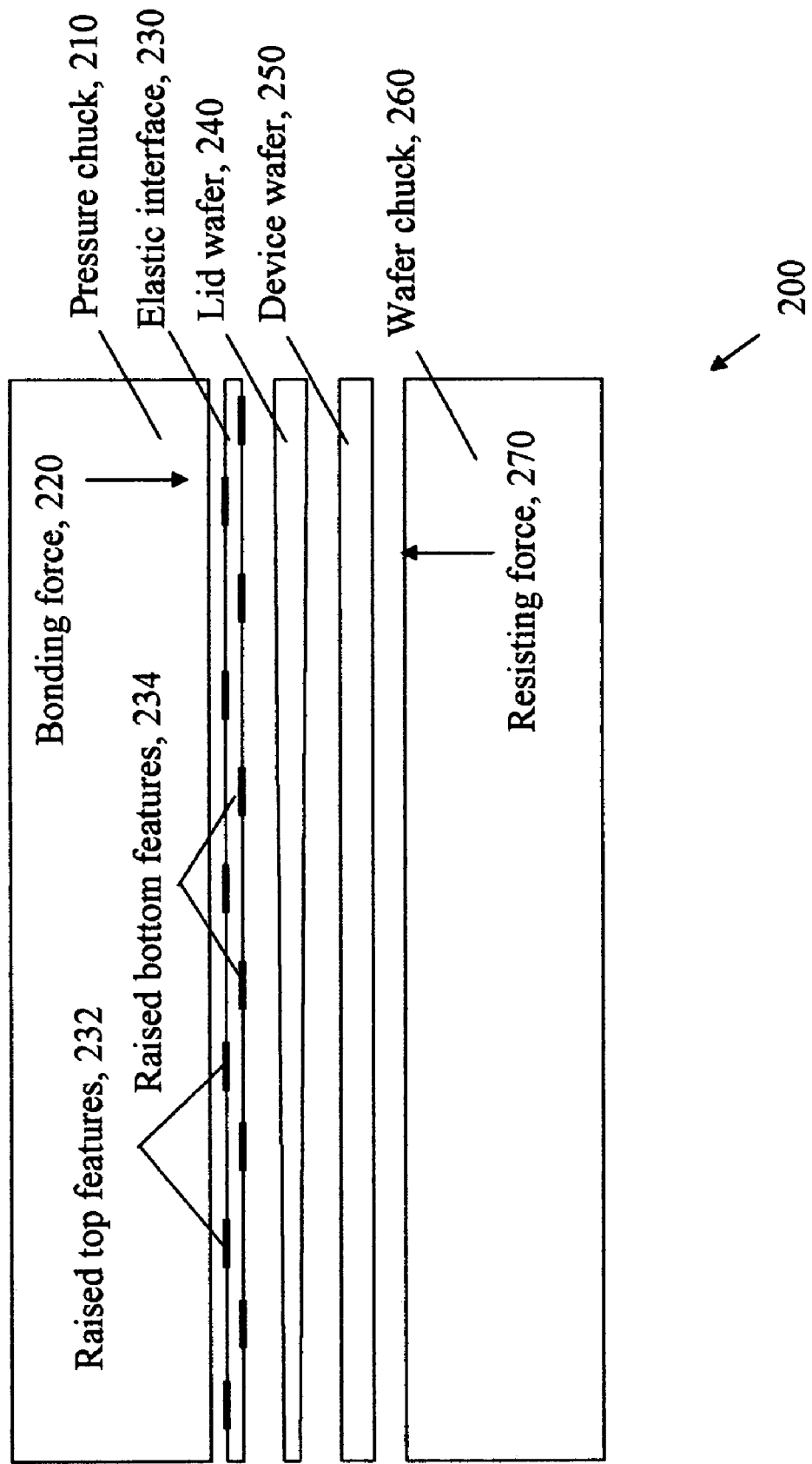
FIG. 2 is a cross sectional view of a first exemplary wafer bonding tool with a elastic interface.

FIG. 2 is a cross sectional view of an exemplary embodiment of a wafer bonding tool 200 using an elastic interface 230. The wafer bonding tool 200, like the prior art tool 100 shown in FIG. 1, has a pressure generating device such as a pressure chuck 210 which delivers a bonding force 220 to a two-wafer assembly, which consists of a lid wafer 240, and a device wafer 250. The device wafer 250 may be seated on a wafer support device such as wafer chuck 260. The wafer chuck 260 delivers a resisting force 270 to the two-wafer assembly, which is equal and opposite to the bonding force 220. Inserted between the pressure chuck 210 and the lid wafer 240 is an elastic interface 230.

Although not shown in FIG. 2, the pressure chuck 210 or the wafer chuck 260 may also be equipped with a heat source, for generating heat to be applied to the two-wafer assembly to cure an adhesive or melt a metal layer to form a metal alloy seal, for example. This adhesive may bond the device wafer 250 to the lid wafer 240. Alternatively, if the wafers are to be bonded anodically, a voltage from a voltage source may be applied between the lid wafer 240 and the device wafer 250 to form the anodic bond. In addition, before mounting in the wafer bonding tool 200, the lid wafer 240 may be precisely aligned to the device wafer 250.

The elastic interface 230 may be made of any material having a suitable spring rate, with yield properties that ensure that the elastic interface 230 will not become plastically deformed within its anticipated range of operation. In particular, the elastic interface may be required to maintain its elastic properties when its temperature is raised to at least the bonding temperature. In order to transmit the heat generated by the heat source to the two-wafer assembly efficiently, the elastic interface may need to have suitable thermal properties. Therefore, any material having these suitable attributes may be used to fabricate the elastic interface.

The elastic interface may be formed as a plurality of relieved or open areas forming a mesh, and the intersection points of the mesh forming nodes adjacent to the relieved or open areas. Relieved areas are areas from which some of the elastic material has been removed. Open areas are areas from which all of the elastic material has been removed. The removal of material in the relieved or open areas lowers the spring rate of the mesh of the elastic interface.

The nodes provide a location for the formation of raised features which are arranged in a staggered relationship between a first and a second surface. Here the first surface is a top surface, and the second surface is a bottom surface. The material of the mesh between the raised features provides the elastic medium which returns the mesh to its original shape after deformation by pressing on the raised features staggered on the top and bottom surfaces. Alternatively, the elastic interface may simply be a continuous sheet with alternating bumps on bottom and top. A continuous sheet has a higher resulting spring rate than a sheet with relieved or open areas forming the mesh.

In the embodiment described below, the design of a mesh is described, which is applicable to a particular situation. It should be understood that this embodiment is presented as an example only, and that the design parameters may be altered to suit any other application. That is, it was determined that a non-uniformity between the top and bottom surfaces of a wafer assembly of about 50 um may exist across a wafer diameter of six inches, at a bonding pressure of about 2000 mB. This non-uniformity may be due to warpage of the wafers, their out-of-flat condition and temperature variations, thickness variations and variability in the surface topography of the wafers, as well as the non-uniformities of the pressure chuck 210 and the wafer chuck 260. This amount of non-uniformity at this pressure, was needed to be accommodated by the elastic interface. Using a Finite Element Analysis, or similar tool, the dimensions required of a given material may be determined, and the mesh designed to accommodate the given non-uniformity. It should be understood that the dimensions set forth below are appropriate for the situation described above, wherein 50 microns of non-uniformity may exist over the six inch diameter wafer, and may be adjusted to accommodate other situations as necessary.

Beryllium copper (BeCu) alloy may be chosen for the material of the elastic interface, because of its superior thermal conductivity, strength and fatigue resistance. The alloy may have between about 1.5% and 2.5% of beryllium, a small amount of cobalt, nickel and iron (less than 1%), and the balance copper. The alloy may have a tensile strength of at least about 500 MPa. BeCu also has good thermal properties, possessing a thermal conductivity of about 0.35-0.45 calories $cm/cm^2$ sec $°$ C. at 20° C. However, it should be understood that this material choice is exemplary only, and that any other material with acceptable thermal and mechanical properties may be chosen, such as shim stock, or a spring steel such as 17-4 PH.

Figure 3:
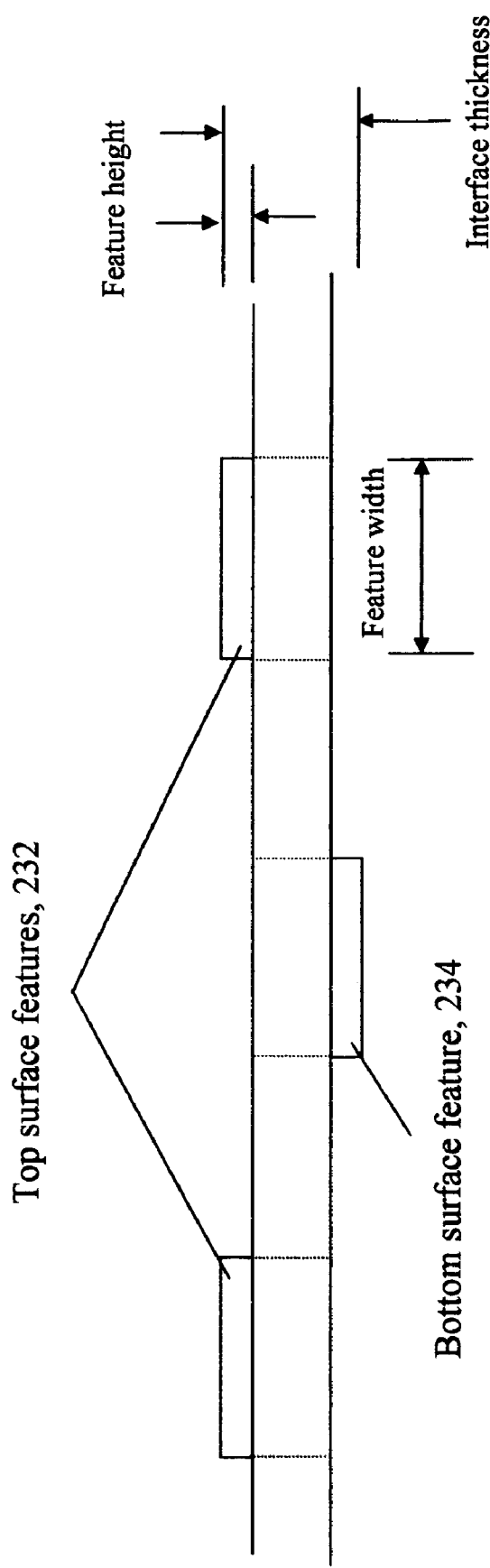
FIG. 3 is a cross sectional view of the exemplary elastic interface in its nominal unflexed position.

The elastic interface 230 is fabricated with a series of raised features 232 along its top surface and a series of raised features 234 along its bottom surface. The top surface features 232 may be staggered or offset from the bottom surface features 234, such that a bottom surface feature 234 may occur midway between each pair of top surface features 232. FIG. 3 shows the arrangement of top surface features 232 and bottom surface features 234 in greater detail. The top surface features 232 and the bottom surface features 234 may be substantially circular in shape, with a diameter of between about 0.5 mm and about 2 mm, and more preferably about 1 mm in diameter. It should be understood that the raised features 232 and 234 may have any other non-circular shape as well. The height of the top surface features 232 and bottom surface features 234 may be between about 0.1 mm and 0.3 mm, and more preferably about 0.2 mm. The total interface thickness, from the top of the top surface features 232 to the bottom of the bottom surface features 234 may be between about 0.25 mm to about 0.75 mm, and more preferably about 0.5 mm. The top raised features may be disposed about 8 mm apart, with a bottom raised feature 234 occurring midway between each pair of top raised features 232, or about 4 mm from the top raised feature 232.

Figure 4:
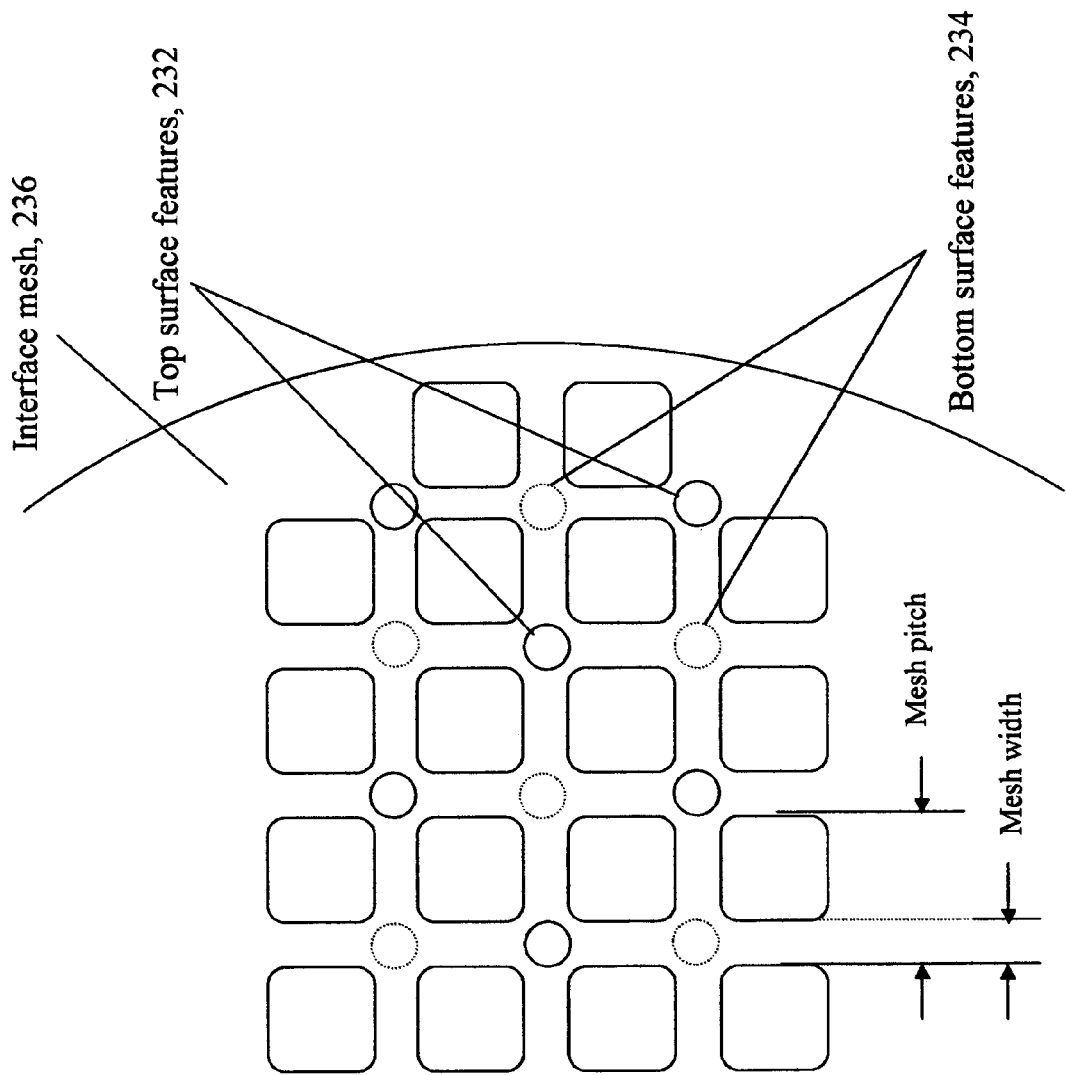
FIG. 4 is a plan view of a portion of the elastic interface.

FIG. 4 is a plan view of the elastic interface 230, showing the mesh 236 which supports the top surface features 232 and the bottom surface features 234. The mesh may surround relieved areas from which at least some material has been removed, or open areas from which all of the material has been removed. The mesh pitch, i.e., the distance between two nodes on the mesh, may be about 4 mm, with a raised feature, either on the top surface or the bottom surface, occurring at each node. The width of the mesh 236 may be about 1 mm, the same as the diameter of the raised features 232 and 234. The width of the open areas in the mesh 236 may therefore be about 3 mm. It should be understood that the dimensions set forth herein are one embodiment only, and that these dimensions may be adjusted to achieve the purposes of any given application. For example, although a mesh pitch of 4 mm is described above, it should be understood that a mesh pitch of 1-6 mm may also be used, depending on the amount of variation in thickness expected in the wafer pair, and the amount of pressure used to bond the wafers. It should also be understood that although the plan view of FIG. 4 shows the raised features in a rectangular array, with a mesh having square open areas, any other arrangement of the raised features may also be used, such as a close-packed hexagonal array, wherein the mesh would have triangular open areas, or the like.

Figure 5:
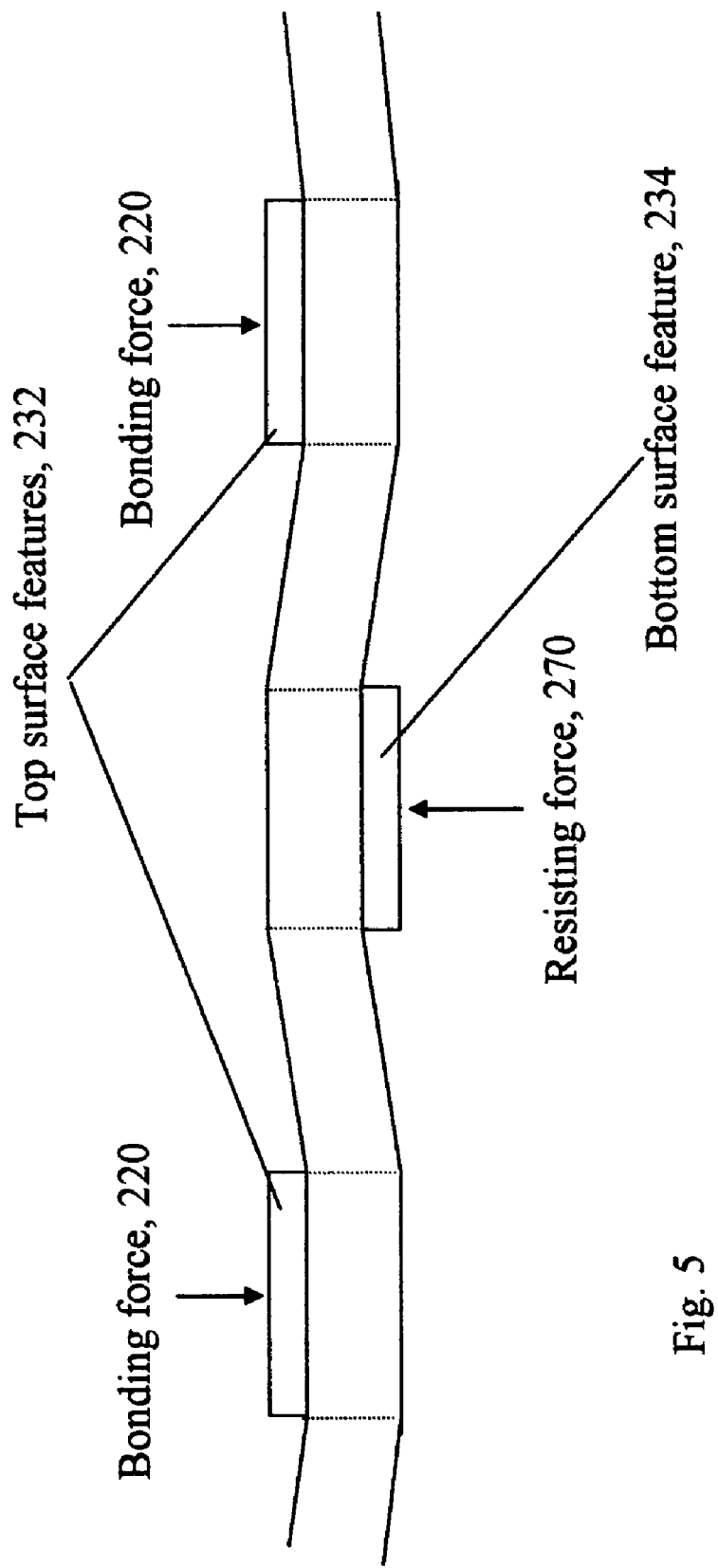
FIG. 5 is a cross sectional view of the exemplary compliant interface in its flexed position, under a load.

FIG. 5 depicts the deformation of the elastic interface during operation, in its flexed position. During operation, the elastic interface 230 is subjected to the bonding force 220 applied by the pressure chuck 210, and the resisting force 270 applied by the wafer chuck 260. The bonding force 220 acts to press down on the raised top features 232, thus deflecting them downward against the spring rate of the elastic mesh. The resisting force 270 similarly acts to press up the raised bottom surface features 234, thus deflecting them upward against the spring rate of the elastic mesh. The spring rate of the mesh resists this deflection, and transfers the bonding force 220 and resisting force 270 to the lid wafer 240 and device wafer 250. As indicated above, the mesh is so designed as to accommodate a 50 μm offset between the top of the top surface features 232 and the bottom of the bottom surface features 234 across the diameter of an approximately six inch diameter wafer.

With the elastic interface deflected as shown in FIG. 5, heat may be applied to the two-wafer assembly, to cure an adhesive applied between the device wafer 250 and the lid wafer 240. Because the bonding force 220 and resisting force 270 are applied more uniformly over the wafer surface, a more reliable and consistent bond may be formed across the whole diameter of the wafer. Therefore, use of the elastic interface 230 may improve the die yield from the wafer. After curing the adhesive, the two wafer assembly may be cooled and removed from the wafer bonding tool and the encapsulated die singulated and further packaged as needed.

The elastic interface 230 may also be used during the cool down phase of the wafer bonding process, wherein the two-wafer assembly is cooled from the bonding temperature to an ambient environmental temperature before removal from the wafer bonding tool. During this cool down, the two-wafer assembly, pressure chuck 210, wafer chuck 260 and elastic interface 230 may be expected to shrink relative to their positions at the bonding temperature. In the absence of the elastic interface, this shrinkage may result in the release of portions of the two-wafer assembly from the bonding force before the bond is fully formed. The presence of the elastic interface 230 may serve to provide more uniform bonding pressure during this cool down phase, so that portions of the two-wafer assembly are not totally released from the bonding force while other portions still have the bonding force applied.

Figure 6:
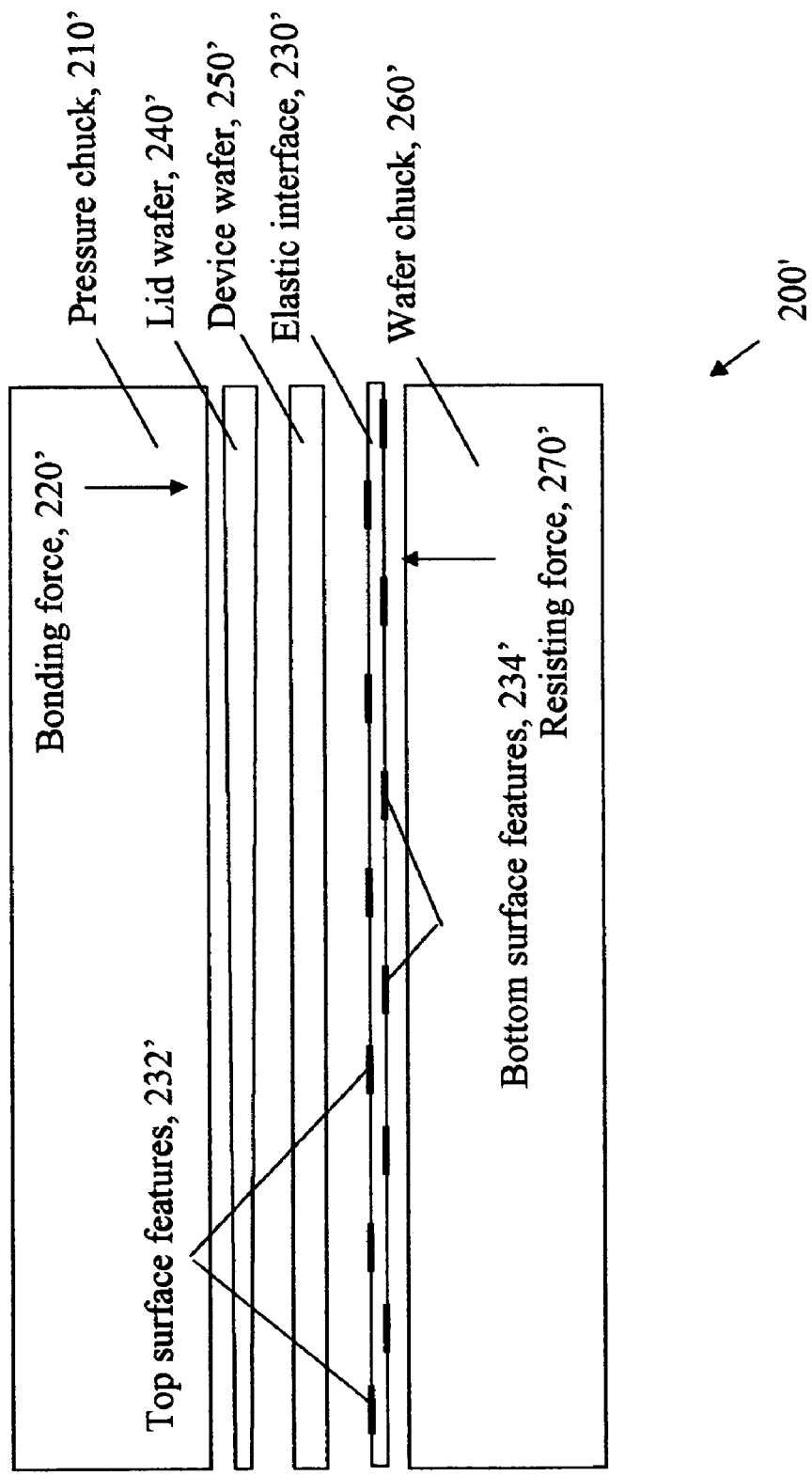
FIG. 6 is a cross sectional view of a second exemplary wafer bonding tool using the elastic interface.

FIG. 6 shows a second exemplary embodiment of a wafer bonding tool 200' using an elastic interface 230'. In this embodiment, the elastic interface 230' is placed below the pressure chuck 210', lid wafer 240' and device wafer 250'. The elastic interface 230' is placed between the device wafer 250' and a wafer support, which is wafer chuck 260'. In this embodiment, the elastic interface 230' serves the same function as elastic interface 230, which is to distribute the bonding force 220' and the resisting force 270' over the whole surface of lid wafer 240' and device wafer 250'. The bonding procedure then proceeds as in the first exemplary embodiment described above.

Figure 7:
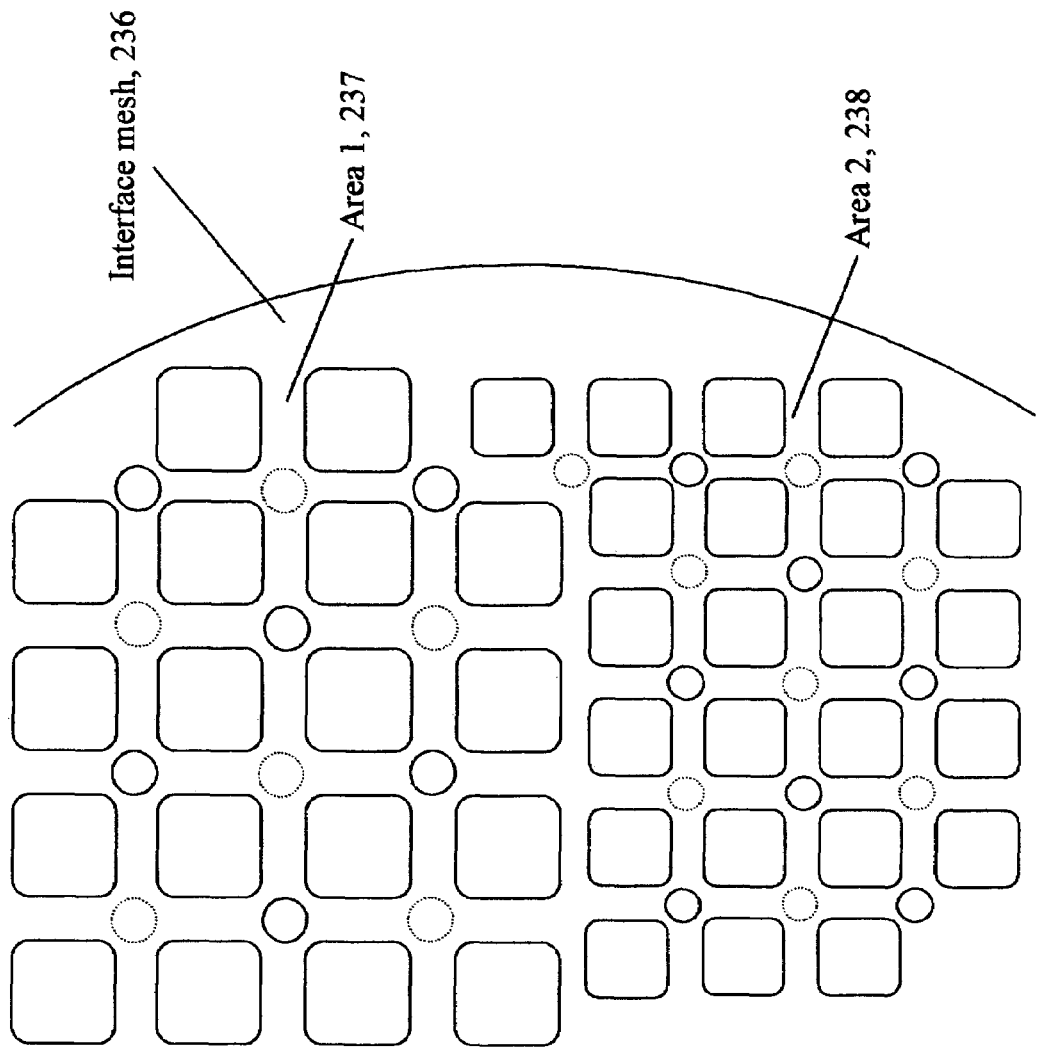
FIG. 7 is a plan view of a third exemplary elastic interface.

Because the elastic interface may be manufactured using photochemical techniques, as described below, the top surface features 232 and bottom surface features 234 may be made in any arbitrary pattern, rather than the regular rectangular array shown in FIG. 4. FIG. 7 shows a third exemplary embodiment of elastic interface 230 wherein the interface mesh 236 varies over the surface of the elastic interface 230. For example, in Area 1 237, the mesh is relatively course, having nodes spaced as in the first embodiment of FIG. 4. However, in area 2 238, the nodes of the mesh are more tightly spaced. Such an approach may be used to tailor the distribution of nodes in any fashion desired, for example, if an adhesive bonding the device wafer 250 and lid wafer 240 is expected to be thicker or more variable in some locations on the wafer surface compared to other locations, relatively widely spaced nodes may be placed over these areas to accommodate the greater variability. This may occur, for example, depending on the nature of the MEMS devices being encapsulated.

Although the embodiment shown in FIG. 7 has two distinct regions of different mesh pitch, Area 1 237 and Area 2 238, it should be understood that this embodiment is exemplary only, and that elastic interfaces 200 may be made having any number of different mesh pitches, or, for example, a mesh pitch which varies smoothly over the surface of the device wafer 250 diameter. The mesh pitch may be designed to accommodate differences in wafer topography due to, for example, changes in bondline height or thickness over various regions of the device wafer 250.

As previously discussed, the elastic interface may be formed from a disk of shim stock, spring steel or BeCu sheet material, having a top surface and bottom surface formed by the equipment used to produce the sheet material. The raised features in the elastic interface may then be formed using any of a number of manufacturing techniques.

Because of the relatively large feature size of the elastic interface 230, the elastic interface 200 may be manufactured relatively inexpensively, using for example, photochemical techniques. That is, photomasks may be created having only the patterns of the top surface features 232 and bottom surface features 234. After applying photoresist to the surface of the elastic interface 230, the photoresist may be exposed only in areas not corresponding to the top surface features 232 or bottom surface features 234. The photoresist may then be developed and dissolved in the exposed areas. The areas in which the photoresist has been removed may then be etched using, for example, an acid etch. This etching may create the top surface features 232 and bottom surface features 234, by removing material surrounding the top surface features 232 and bottom surface features 234. The photoresist and acid etch may therefore be the means for forming the plurality of raised features.

Photoresist may then be reapplied to the surface of elastic interface 230. The photoresist may then be exposed in areas corresponding to the relieved or open areas of the mesh. The photoresist may then be developed and dissolved to remove the photoresist in the relieved or open areas. An acid etch may then be applied to the surface of elastic interface 200, to remove the material in the relieved or open areas. The acid etch may be allowed to remove some or all of the elastic material in the relieved or open areas. Using such photochemical techniques, total manufacturing cost is expected to be on the order of $20 per unit, as compared to the graphite pad which sells for about $5-10 per unit. Furthermore, the lifetime of the elastic interface described herein is expected to be essentially infinite, whereas the deformable graphite pad has a useable lifetime of tens of bonding cycles.

While a photochemical procedure is described for the manufacture of the elastic interface 230, it should be understood that this is exemplary only, and that other techniques may be employed to manufacture elastic interface 230. Such other techniques may include, for example, stamping the mesh from shim stock, for example, and forming or depositing the top surface features 232 and bottom surface features 234 on the surface of the stamped material.

While various details have been described in conjunction with the exemplary implementations outlined above, various alternatives, modifications, variations, improvements, and/or substantial equivalents, whether known or that are or may be presently unforeseen, may become apparent upon reviewing the foregoing disclosure. For example, while the disclosure describes an embodiment including a MEMS device wafer, it should be understood that this embodiment is exemplary only, and that the systems and methods disclosed here may be applied to any number of alternative CMOS wafers, for example. Similarly, the embodiment is described with respect to a photochemical manufacturing method. However, it should be understood that other manufacturing techniques may be employed to produce the elastic interface, such as stamping. Accordingly, the exemplary implementations set forth above, are intended to be illustrative, not limiting.

What is claimed is:

1. A wafer bonding tool, comprising:
    a movable pressure chuck and a wafer support device;
    a single sheet of elastic material having a first surface and a second surface on a side opposite the first surface, wherein the single sheet is disposed between the pressure chuck and the wafer support device; and
    a plurality of raised features disposed on the first and second surfaces, with the raised features on the first surface disposed in a staggered position with respect to the raised features on the second surface.

2. The wafer bonding tool of claim 1, wherein the raised features on the first surface are disposed on every other node, and the raised features on the second surface are disposed on every intervening node.

3. The wafer bonding tool of claim 1, further comprising at least one of beryllium copper, shim stock and spring steel.

4. The wafer bonding tool of claim 1, wherein the raised features of the elastic interface have a height of between about 0.1 mm and 0.3 mm relative to at least one of the first and the second surface, and a width of about 1 mm.

5. The wafer bonding tool of claim 1, wherein the relieved areas are substantially square, with a width of about 3 mm.

6. The wafer bonding tool of claim 1, wherein the elastic sheet has a total thickness of about 0.5 mm.

7. The wafer bonding tool of claim 1, wherein a pitch between the raised features varies across a diameter of the elastic interface.

8. The wafer bonding tool of claim 1, further comprising:
    a pressure device generating pressure; and
    a heat source.

9. The wafer bonding tool of claim 8, wherein the elastic sheet is disposed between the pressure device and a two-wafer assembly.

10. The wafer bonding tool of claim 9, wherein the wafer support device supports the two-wafer assembly.

11. The wafer bonding tool of claim 10, wherein elastic sheet is disposed between the two-wafer assembly and the wafer support device.

12. The wafer bonding tool of claim 8, wherein the elastic sheet can accommodate at least about 50 μm of flatness non-uniformity across a six inch diameter wafer.

13. The wafer bonding tool of claim 9, further comprising a voltage source for applying a voltage across the two-wafer assembly.

14. The wafer bonding tool of claim 9, wherein the two-wafer assembly compnses:
    at least one substantially circular device wafer, upon which devices are disposed; and
    a substantially circular lid wafer coupled to the substantially circular device wafer, wherein the raised features on the elastic sheet are configured to deliver pressure from the pressure chuck to the lid wafer and device wafer in the wafer bonding tool.

15. The wafer bonding tool of claim 1, wherein the raised features are circles disposed on the nodes of the mesh of the elastic sheet.

16. The wafer bonding tool of claim 1, wherein the pitch between the nodes of the elastic sheet varies smoothly across the diameter of the elastic sheet.

* * * * *